United States Patent
Neyret et al.

(10) Patent No.: US 7,939,427 B2
(45) Date of Patent: May 10, 2011

(54) PROCESS FOR FABRICATING A SUBSTRATE OF THE SILICON-ON-INSULATOR TYPE WITH REDUCED ROUGHNESS AND UNIFORM THICKNESS

(75) Inventors: Eric Neyret, Sassenage (FR); François Boedt, Meylan (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 244 days.

(21) Appl. No.: 11/849,912

(22) Filed: Sep. 4, 2007

(65) Prior Publication Data

US 2009/0035920 A1    Feb. 5, 2009

(30) Foreign Application Priority Data

Feb. 1, 2007   (FR) ..................................... 07 00720

(51) Int. Cl.
  *H01L 21/30* (2006.01)
  *H01L 21/46* (2006.01)
  *H01L 21/322* (2006.01)
(52) U.S. Cl. ................... 438/459; 438/458; 257/E21.32
(58) Field of Classification Search .................. 438/455, 438/458–459
  See application file for complete search history.

(56) References Cited

U.S. PATENT DOCUMENTS

| | | | |
|---|---|---|---|
| 5,966,620 A | 10/1999 | Sakaguchi et al. | 438/455 |
| 6,362,076 B1 * | 3/2002 | Inazuki et al. | 438/458 |
| 6,372,609 B1 | 4/2002 | Aga et al. | 438/459 |
| 2003/0077885 A1 * | 4/2003 | Aspar et al. | 438/517 |
| 2003/0181001 A1 | 9/2003 | Aga et al. | 438/200 |
| 2004/0161948 A1 | 8/2004 | Maleville et al. | 438/795 |
| 2004/0188487 A1 * | 9/2004 | Barge et al. | 225/103 |
| 2005/0026426 A1 * | 2/2005 | Maleville et al. | 438/663 |
| 2005/0042841 A1 * | 2/2005 | Boyd et al. | 438/458 |
| 2006/0051945 A1 * | 3/2006 | Yokokawa et al. | 438/526 |
| 2006/0160328 A1 | 7/2006 | Daval | 438/455 |
| 2006/0172508 A1 * | 8/2006 | Maleville et al. | 438/459 |
| 2006/0177991 A1 | 8/2006 | Murakami et al. | 438/455 |
| 2006/0177993 A1 | 8/2006 | Endo et al. | 438/458 |
| 2006/0189102 A1 | 8/2006 | Barge et al. | 438/475 |

FOREIGN PATENT DOCUMENTS

EP    0 843 344 B1    5/1998

(Continued)

*Primary Examiner* — Savitri Mulpuri
*Assistant Examiner* — Calvin Choi
(74) *Attorney, Agent, or Firm* — Winston & Strawn LLP

(57) ABSTRACT

A process for fabricating a silicon on insulator (SOI) substrate by co-implanting atomic or ionic species into a semiconductor donor substrate to form a weakened zone therein, the weakened zone forming a boundary between a thin silicon active layer and the remainder of the donor substrate. The donor substrate is then bonded to a semiconductor receiver substrate by molecular adhesion, resulting in a layer of buried silicon interposed between the donor substrate and the receiver substrate. The remainder of the donor substrate is detached along the weakened zone to obtain a SOI substrate with the receiver substrate covered with the buried oxide layer and the thin silicon active layer. The silicon active layer is then thermally annealed for at least 10 minutes in a gaseous atmosphere containing hydrogen, argon or both at a temperature of at least 950° C. but not exceeding 1100° C. The annealing step minimizes roughness of the surface of the silicon active layer, prevents reduction in thickness of the buried oxide layer, and achieves uniform thickness of the thin silicon active layer and the buried oxide layer.

15 Claims, 4 Drawing Sheets

FOREIGN PATENT DOCUMENTS

| | | |
|---|---|---|
| EP | 1 662 555 A1 | 5/2006 |
| EP | 1 688 990 A2 | 8/2006 |
| EP | 1 688 991 A2 | 8/2006 |
| FR | 2 797 713 | 2/2001 |
| FR | 2 827 423 | 1/2003 |
| FR | 2 858 462 | 2/2005 |
| FR | 2 861 497 | 4/2005 |

* cited by examiner

PROCESS FOR FABRICATING A SUBSTRATE OF THE SILICON-ON-INSULATOR TYPE WITH REDUCED ROUGHNESS AND UNIFORM THICKNESS

FIELD OF THE INVENTION

The present invention relates to the field of processes for fabricating silicon on insulator (SOI) substrates. More particularly, the invention relates to the finishing steps of SOI substrates.

BACKGROUND

SOI substrates are composed of a silicon oxide ($SiO_2$) layer buried between a bulk silicon substrate and thin silicon layer. These substrates are intended to be used in the fields of electronics, optics or optoelectronics.

An example of a process for fabricating an SOI substrate is disclosed in U.S. Patent Application No. 2003/0181001. The disclosed process involves ion implantation into a surface-oxidized substrate and delamination of the wafer. This substrate is then bonded to a support and then an annealing operation is carried out at temperatures between 400° C. and 600° C. to detach a portion of the substrate.

To reduce the roughness of the newly exposed portion of the substrate, a finishing annealing operation is then carried out in an atmosphere containing hydrogen, an inert gas, or a mixture of the two gases, at a temperature between 1100° C. and 1350° C. This temperature range is chosen to limit the annealing time and to avoid any contamination by impurities, such as heavy metals.

US 2003/0181001 specifies that heat treatment is carried out by annealing for a time between 10 minutes and 8 hours, or by a technique known to those skilled in the art as RTA (rapid thermal annealing). In the latter case, this process is carried out in an RTA annealing apparatus that allows temperature increases of greater than 10° C./s, and relatively short annealing times of around 30 seconds to 1 minute. Finally, this annealing step is followed by a sacrificial oxidation step.

The process described in US 2003/0181001 has several drawbacks, namely the partial dissolution of the buried oxide layer and the lack of homogeneity in the reduction in roughness of the silicon active layer. Annealing for several hours at the proposed temperature ranges, which may be up to 1350° C., results in at least partial dissolution of the buried silicon oxide ($SiO_2$) layer, by diffusion of the oxygen forming the silicon dioxide and by evaporation of this oxygen at the surface of the silicon active layer. For high annealing temperatures above about 1200° C., the dissolution phenomenon is also linked with the increase in solubility of oxygen in silicon and consequently its dissolution in the bulk substrate and the silicon active layer. This effect is even more pronounced for thin silicon layers with a thickness of 200 nanometers or less. In addition, the diffusion of oxygen is not homogeneous through the active layer. Consequently, the SOI substrate obtained has a buried oxide layer of poorly controlled thickness; the thickness is both less than that normally expected in the absence of the aforementioned diffusion phenomenon and also not uniform over the entire surface of the substrate.

Tests have been carried to measure these drawbacks. The results are plotted in the appended FIG. 1, which shows on the y-axis the thickness $E_{SiO2}$ of the buried silicon dioxide layer of an SOI substrate after thermal annealing and on the x-axis the average thickness $E_{Si}$ of the silicon active layer before annealing. The thicknesses are expressed in nanometers. Curves a, b and c represent the results obtained after annealing at temperatures of 1100° C., 1150° C. and 1200° C., respectively.

Additional results are plotted FIG. 2. The y-axis represents the change in standard uniformity $\Delta_{SiO2}$ as a result of annealing the buried silicon dioxide layer and x-axis represents the thickness $E_{Si}$ of the silicon active layer before annealing, expressed in nanometers. Curves d, e and f represent the results obtained after annealing at temperatures of 1100° C., 1150° C. and 1200° C., respectively. An annealing operation at, for example, 1200° C. is an operation during which the temperature gradually rises over several hours and is then held for 5 minutes at 1200° C.

As may be seen in FIG. 1, the higher the annealing temperature, the thinner the buried $SiO_2$ layer. Moreover, the thinner the silicon active layer, the greater the reduction in the thickness of the buried silicon layer, especially for annealing above 1100° C. Thus, after annealing at 1200° C. (see curve c) and for silicon active layer thicknesses greater than 200 nanometers, a reduction in the thickness of the $SiO_2$ of around 6 nanometers (compared with curve a) is observed, as shown in FIG. 2.

The term "thickness uniformity" denotes the maximum deviation in thickness of the buried $SiO_2$ layer within the SOI wafer. A uniformity of 1 to 1.5 nm for a buried $SiO_2$ layer with an average thickness of 145 nm is acceptable and commonplace. Moreover, the "change in thickness uniformity" on the final product corresponds to the change between the thickness uniformity values measured before and after the annealing, respectively. The 0% value of the change in uniformity in FIG. 2 corresponds to the case in which there is no change in thickness uniformity. The uniformity remains the same as that of the buried $SiO_2$ layer before the annealing, that is to say of about 1 to 1.5 nm for an $SiO_2$ layer whose thickness before annealing was 145 nm.

For a silicon active layer with a thickness of 100 nanometers or less, however, the reduction in the thickness of the buried $SiO_2$ layer exceeds 10 nanometers (see FIG. 1). The change in uniformity may be up to 500%, as shown in curve f, having an initial uniformity value of 1 to 1.5 nm, rising to 5 to 7.5 nm after annealing. FIG. 2 also shows that this phenomenon, illustrating that the loss in thickness uniformity of the buried oxide layer is even greater for SOI substrates having a thin silicon layer less than 60 nm.

In addition, other tests carried out have shown that long annealing in an atmosphere containing hydrogen and/or argon is not completely effective for minimizing the roughness of the surface of the silicon active layer. Further, tests indicate that this annealing process fails to accomplish a uniform reduction in roughness.

It is also known from document US 2003/0134489 that a fracture in a substrate, obtained by implantation followed by detachment annealing, leads to the formation of a thin, detached layer on the surface of the substrate. This thin detached layer is a particularly rough and damaged localized zone, hereafter in the description called "dense zone". This dense zone is located on the edge of the substrate wafer. It corresponds to the zone where the detachment was initiated, that is to say also to the zone in which the hottest point in the furnace, in which the detachment annealing is carried out, is located. This effect is particularly appreciable when the detachment is carried out purely thermally and when the implanted species consists only of $H^+$ ions.

Typically, after a first rapid smoothing anneal, it has been observed that the measured roughness in the dense zone can be more than 30% higher than on the rest of the wafer. Solutions in the prior art to address this problem include annealing for long periods and/or at high temperature to minimize the roughness in the dense zone. This solution is inadequate, however, as it further exacerbates the dissolution phenomenon. Thus, improvements in these processes are desired.

SUMMARY OF THE INVENTION

The invention now solves the aforementioned drawbacks of the prior art. In particular, the invention provides a fabrication process which makes it possible to obtain a SOI substrate, the thin silicon active layer of which has surface roughness that is uniform and preferably is as thin as possible, while still having a buried layer of uniform thickness.

For this purpose, the invention relates to a process for fabricating a SOI substrate. First, atomic or ionic species are implanted into a semiconductor substrate called the "donor" substrate to form therein a weakened zone. This weakened zone forms the boundary between the thin active layer and the remainder of the donor substrate. The donor substrate is then bonded by molecular adhesion to a substrate called the "receiver" substrate, with a layer of oxide being interposed, or buried, between the two. Next, the remainder of the donor substrate is detached along the weakened zone to obtain a SOI substrate with the receiver substrate, an oxide layer and a thin active layer. Lastly, one or more finishing steps are carried out on the thin layer, including at least one long thermal annealing step for a time of at least 10 minutes, in a gaseous atmosphere containing hydrogen and/or argon to minimize roughness of the thin active layer surface and avoid a reduction in thickness of the oxide layer, while achieving uniform surface roughness of thin active layer, and uniform thickness of the oxide layer. To avoid formation of dense zones adjacent the thin active layer, the implantation is a co-implantation of two different atomic species or the detaching is initiated by a mechanical action along the weakened zone.

Preferably, the receiver substrate includes silicon, the donor substrate, and the thin active layer also include silicon, and the oxide is silicon dioxide. The latter can be formed by oxidation of the receiver substrate, donor substrate, or both prior to bonding.

According to one embodiment of the invention, a weakened zone is formed by co-implantation of atomic or ionic species, detachment is accomplished mechanically, and at least one long annealing step is carried out at a temperature of at least 950° C. but not exceeding 1100° C. Alternatively, the implantation can be of a single atomic species, preferably hydrogen and the detaching is initiated by the application of mechanical forces.

According to other advantageous but nonlimiting features of the invention, taken individually or in combination:

finishing steps may include at least one sacrificial oxidation of a free surface of the thin layer followed by a deoxidation to eliminate the material damaged by the detachment step;

a weakened zone may be formed by hydrogen/helium co-implantation;

detachment may be initiated by a mechanical action on the weakened zone;

the detachment may be accomplished by:
  applying a heat treatment for further weakening the weakened zone, without initiating thermal detachment from the remainder of the donor substrate, and
  applying a pulse that induces self-sustained detachment from the remainder of the donor substrate;

the silicon oxide ($SiO_2$) layer may be formed by thermal oxidation of the donor substrate and/or of the receiver substrate and in bonding the two substrates to each other so that the silicon oxide ($SiO_2$) layer is buried and lies at the interface;

sacrificial oxidation may be carried out under dry or wet conditions, at a temperature between 700° C. and 1100° C.;

the annealing may be carried out for a maximum time of 15 hours;

the thin silicon layer may have, over its entire extent, an RMS surface roughness of less than 3 ångströms over a scanning area of 30 μm×30 μm;

the thickness of the thin silicon layer may be 200 nanometers or less;

the thickness of the buried silicon oxide ($SiO_2$) layer may be 50 nanometers or less; and the thickness uniformity of the buried silicon oxide ($SiO_2$) layer may be 1.8 nm or better.

BRIEF DESCRIPTION OF THE DRAWINGS

Other features and advantages of the invention will become apparent from the description that will now be given, with reference to the appended drawings, which show, by way of indication but implying no limitation, one possible embodiment thereof.

In these drawings.

DETAILED DESCRIPTION OF THE PREFERRED EMBODIMENTS

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

The process of the present invention includes a first series of steps for the formation, detachment and transfer of a thin layer onto a donor substrate, illustrated in FIGS. 3A to 3D, and a second series of steps for finishing, illustrated in FIGS. 3E to 3H.

Figure 1:
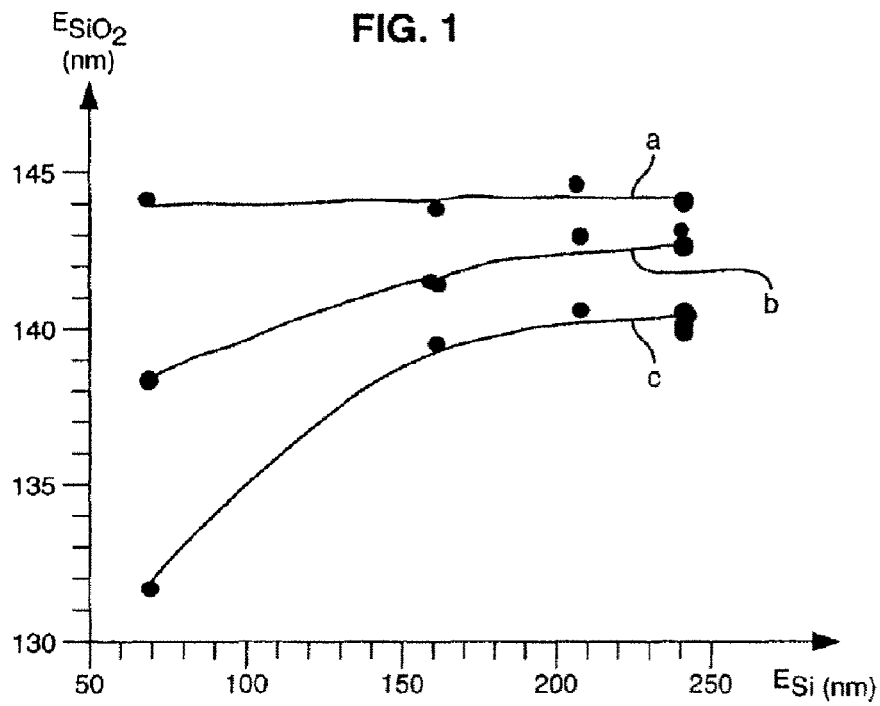
FIG. 1 is a graph showing the thickness $E_{SiO2}$ of the silicon dioxide layer of an SOI substrate after annealing as a function of the thickness $E_{Si}$ of the thin silicon layer before annealing, for heat treatments carried out at various temperatures and in accordance with the prior art.
Figure 2:
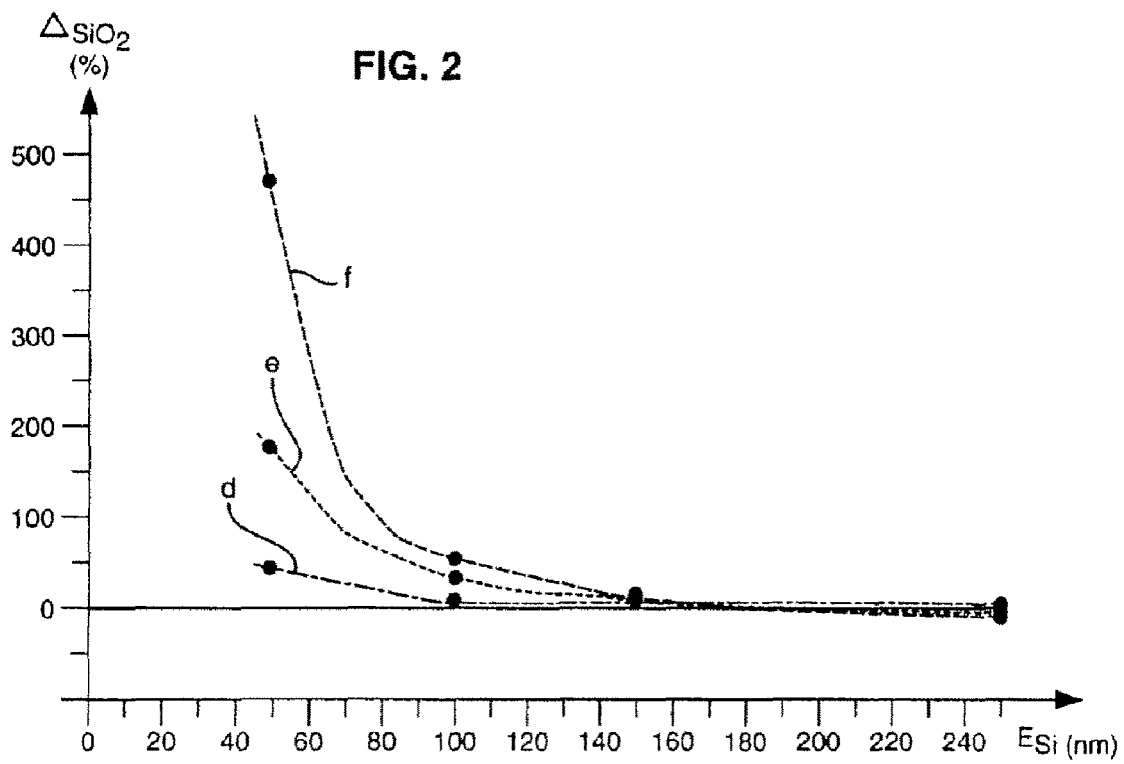
FIG. 2 is a graph showing the change in thickness uniformity $\Delta_{SiO2}$ as a result of the annealing of the silicon dioxide layer of an SOI substrate as a function of the thickness $E_{Si}$ of the thin silicon layer before annealing, for heat treatments carried out at various temperatures and in accordance with the prior art.
Figure 3A:
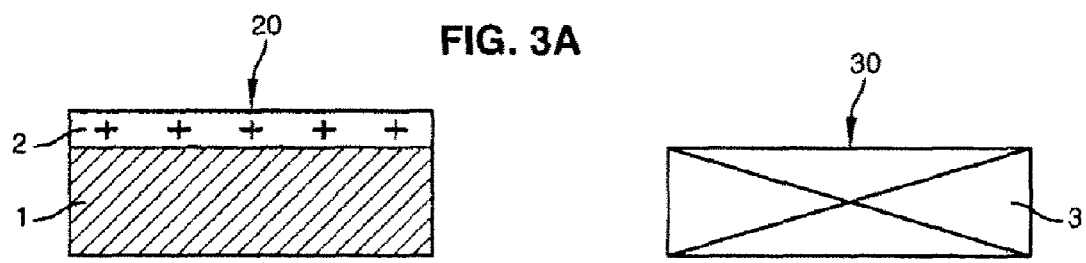
FIGS. 3A to 3H are diagrams showing the various steps of the process of forming an SOI substrate in accordance with one embodiment of the present invention.

FIG. 3A shows a donor substrate 1 made of preferably single-crystal silicon (Si) covered with a silicon dioxide ($SiO_2$) insulator layer 2 (which is also referred to as the oxide layer), the free surface of which bears the numerical reference 20. The oxide layer 2 may result from thermal oxidation of the donor substrate 1 or may have been formed by deposition, conventionally by one of the chemical vapor deposition techniques known to those skilled in the art by the acronyms "CVD" (Chemical Vapor Deposition) and "LPCVD" (Low Pressure Chemical Vapor Deposition). FIG. 3A also shows a receiver substrate 3, made of single-crystal or polycrystalline silicon.

Figure 3B:
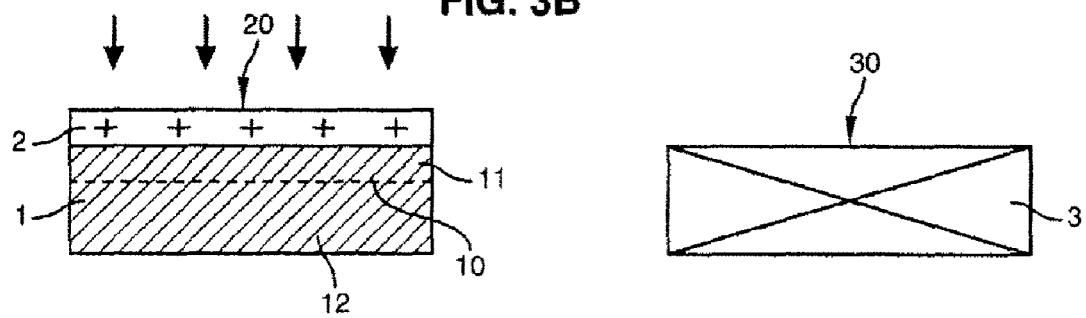

As can be seen in FIG. 3B, the donor substrate 1 is then subjected to implantation of atomic or ionic species through the oxide layer 2. The expression "implantation of atomic or ionic species" is understood to mean any bombardment by these species capable of introducing them into the donor substrate with a maximum concentration at a predetermined depth for the purpose of creating weakened zone 10. This type of implantation may be carried out for example using the process known by the name SMART-CUT®.

Further details concerning this process may be found in the document by G. Celler, entitled "Frontiers of Silicon-on-Insulator", Journal of Applied Physics, Vol. 93, no. 9, May 1, 2003, pages 4955-4978.

Implantation forms a weakened zone 10 along the longitudinal axis of the donor substrate 1 between a thin silicon layer 111 and the remainder of the donor substrate 12. The implantation of atomic or ionic species may be a single implantation, that is to say implantation of a single atomic species, such as for example an implantation of hydrogen, helium or another rare gas. The implantation may also be a co-implantation of atomic or ionic species, that is to say successive implantation of at least two different species, such as for example co-implantation of hydrogen and helium. The choice of one or other of these implantations will be explained later.

The following implantation conditions may be used as an example:

implantation of just hydrogen: the implantation dose is preferably between $4 \times 10^{16}$ $H^+/cm^2$ and $7 \times 10^{16}$ $H^+/cm^2$ and the implantation energy between 20 keV and 100 keV;

co-implantation of helium and hydrogen: preferably, in the case of helium, the implantation dose is between $0.5 \times 10^{16}$ $He^+/cm^2$ and $2 \times 10^{16}$ $He^+/cm^2$ and the implantation energy between 20 keV and 100 keV, and in the case of hydrogen, the implantation dose is between $0.5 \times 10^{16} H^+/cm^2$ and $2 \times 10^{16} H^+/cm^2$ and the implantation energy between 20 keV and 100 keV.

In the case of co-implantation of hydrogen and helium, the helium is preferably implanted before the hydrogen.

Figure 3C:
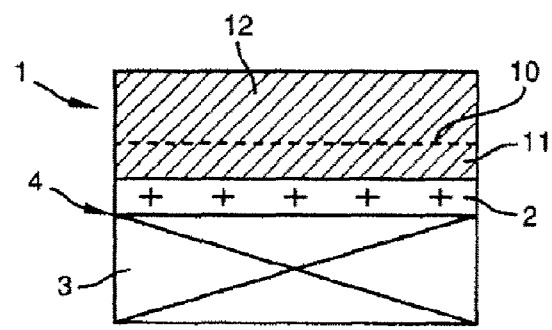

FIG. 3C shows the step of joining the receiver substrate 3 do the donor substrate. Specifically face 30 of the receiver substrate 3 is brought into contact with the face 20 of the oxide layer 2 of the donor substrate 1. The bonding between the two substrates takes place by molecular adhesion and the bonding interface bears the numerical reference 4. This assembly results in the oxide layer 2 being buried between the donor substrate 1 and the receiver substrate 3.

Although this has not been shown in the Figures, it would also be conceivable to form or deposit the oxide layer 2 on the receiver substrate 3 and then to bond the assembly to a donor substrate 1 that has already undergone the implantation for forming the weakened zone 10. However, in this case, it would be preferable to form or deposit a protective insulation layer on the donor substrate 1 before carrying out the implantation. Optionally, the protective layer can be removed before the bonding.

Figure 3D:
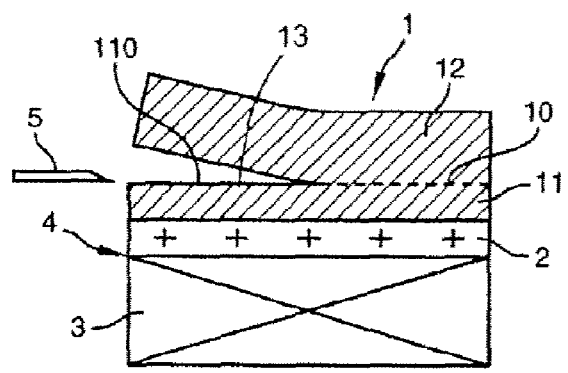

FIG. 3D shows the next step in the process where the remainder 12 of the donor substrate is detached. Detachment occurs along the weakened zone 10, resulting in the thin silicon layer 11 being present on top of the buried oxide layer 2 and the support substrate 3. The detachment may be carried out either purely thermally or mainly mechanically, depending on selection criteria that will be explained later. The purely thermal detachment consists in subjecting the multilayer stack obtained in FIG. 3C to thermal annealing, during which spontaneous detachment from the remainder 12 takes place along the weakened zone 10. This thermal detachment is carried out at temperatures between 300° C. and 600° C., preferably at about 500° C., for a time long enough to obtain this detachment, typically around one hour.

In the rest of the description and the claims, the expression "mainly mechanical detachment" is understood to mean either a purely mechanical detachment or a hybrid detachment. Purely mechanical detachment is initiated by a mechanical action, for example by running a blade 5 along the weakened zone 10 from one side of the substrate. Hybrid detachment involves both heat and mechanical treatment. More precisely, this hybrid treatment can include:

applying a heat treatment to controllably weaken the substrate and form the weakened zone 10, or applying heat treatment and interrupting the treatment before detachment is initiated; followed by applying an energy pulse that triggers "self-sustained" detachment along weakened zone 10.

An energy pulse may be applied using a machine for automatically separating wafers, for example a machine as described in US patent application 2006/138189. The mechanical force exerted by such a separating machine is sufficient to induce "self-sustained" detachment, that is, shock is sufficient to initiate and sustain the detachment and, unlike purely mechanical detachment, there is no movement of a tool along the weakened zone. Since the detachment is self-sustained, there is no actual sudden propagation of a fracture wave liable to generate surface undulations. Furthermore, since there is no movement of any tool along the newly created surfaces, there is no degradation of the surface finish of the surfaces thus freed.

The free surface 110 of the thin silicon active layer 11 (FIG. 3D) thus has a much lower roughness than when a thin layer is obtained by spontaneous detachment resulting from purely thermal annealing. In particular, the applicant has observed that the roughness of the surface 110 is greatly reduced on the edge of the wafer, in the dense zone 13 that is observed with the techniques of the prior art. The dense zone is apparent along the perimeter of the surface 110.

According to the invention, during the first series of steps that have just been described, the aim is to carry out the implantation and detachment steps so as to minimize the occurrence of a dense zone with a high roughness. Consequently, the chosen procedure is:

to form the weakened zone 10 by co-implantation of atomic or ionic species and/or to cause detachment from the remainder 12 by a mainly mechanical technique.

The finishing steps will now be described.

A sacrificial oxidation operation is carried out on the surface of the thin silicon layer 11. This operation is made up of an oxidation step, shown in FIG. 3E, which may be followed by a heat treatment and then by a deoxidation step, shown in FIG. 3F.

The first step of oxidation is preferably accomplished at a temperature between 700° C. and 1100° C. It may be performed under dry conditions, for example by heating the SOI substrate in a gaseous atmosphere, or under wet conditions, for example by heating in an atmosphere containing water vapor. Whether the oxidation is carried out under dry or wet conditions, the oxidation atmosphere may also be charged with hydrochloric acid. The oxidation step results in the formation of a sacrificial silicon oxide ($SiO_2$) layer 111 on the surface of the thin silicon active layer 11.

The optional heat treatment second step that follows may be carried out by increasing the temperature at a constant or varying rate until a temperature of above about 1000° C., and preferably between about 1100° C. and 1200° C., is reached, in a nonoxidizing gaseous atmosphere. The gaseous atmosphere contains for example argon, nitrogen, hydrogen or other nonoxidizing gases, or a mixture of these gases. The heat treatment may also be carried out under a vacuum. The duration of this heat treatment is typically about 2 hours. It should be noted that this heat treatment may be carried out up to a temperature of 1200° C. without any risk of the buried oxide layer 2 dissolving, since the free surface 110 of the silicon active layer 11 which is oxidized at 111, prevents this phenomenon.

Figure 3E:
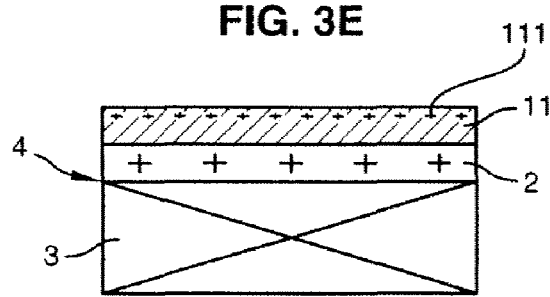
Figure 3F:
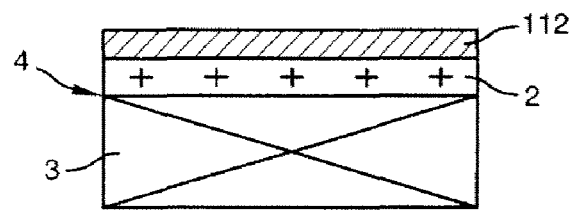

Finally, the total deoxidation step shown in FIG. 3F allows the sacrificial silicon oxide layer 111 formed during the oxidation step to be removed. This step is for example carried out by immersing the SOI substrate for a few minutes in a solution of hydrofluoric acid (HF) diluted in water to 10 or 20% by volume, for example.

A few minutes of immersion of the substrate in this solution is sufficient for removing the sacrificial silicon oxide layer 111, the thickness of which generally varies from about a hundred to a few hundred nanometers. This way, the portion of silicon of the thin layer 11 that was damaged during detachment, including the dense zone, is removed. The thin residual silicon layer bears the numerical reference 112. It is slightly thinner than the silicon active layer 11.

Figure 3G:
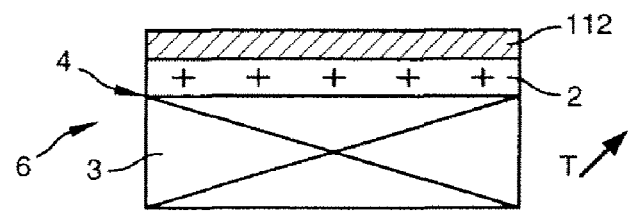

According to the invention, and as shown in FIG. 3G, a thermal annealing to smooth the SOI substrate is carried out in a gaseous atmosphere of hydrogen and/or argon, in the absence of oxygen, at a temperature T of at least 950° C. but not exceeding 1100° C., preferably at least 950° C. but below 1100° C. This annealing is called long annealing. The SOI substrate is held in the aforementioned temperature range for at least about 10 minutes and for a maximum time of a few hours, possibly even up to 15 hours. When annealing is performed for less than 10 minutes, the treatment is ineffective and when the annealing exceeds 15 hours, it is no longer economic, due to production costs. This annealing is carried out in a suitable furnace. The SOI substrate obtained bears the reference 6.

It should be noted that the sacrificial oxidation step shown in FIGS. 3E and 3F is optional. When sacrificial oxidation it is carried out, it can be performed after the long annealing step of FIG. 3G.

Figure 3H:
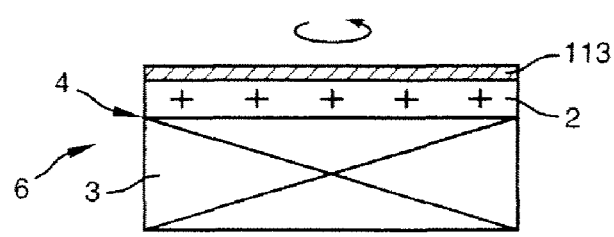

Finally, as shown in FIG. 3H, it is possible, optionally, to carry out a chemical-mechanical thinning operation on the residual silicon layer 112 which, once thinned, bears the reference 113.

Measurements have been carried out to observe that by forming the weakened zone 10 by co-implantation of atomic or ionic species and/or by causing detachment by a mainly mechanical fracture, it is possible, surprisingly, to limit or even completely eliminate the dense zone that occurs when prior art techniques are used.

Figure 4:
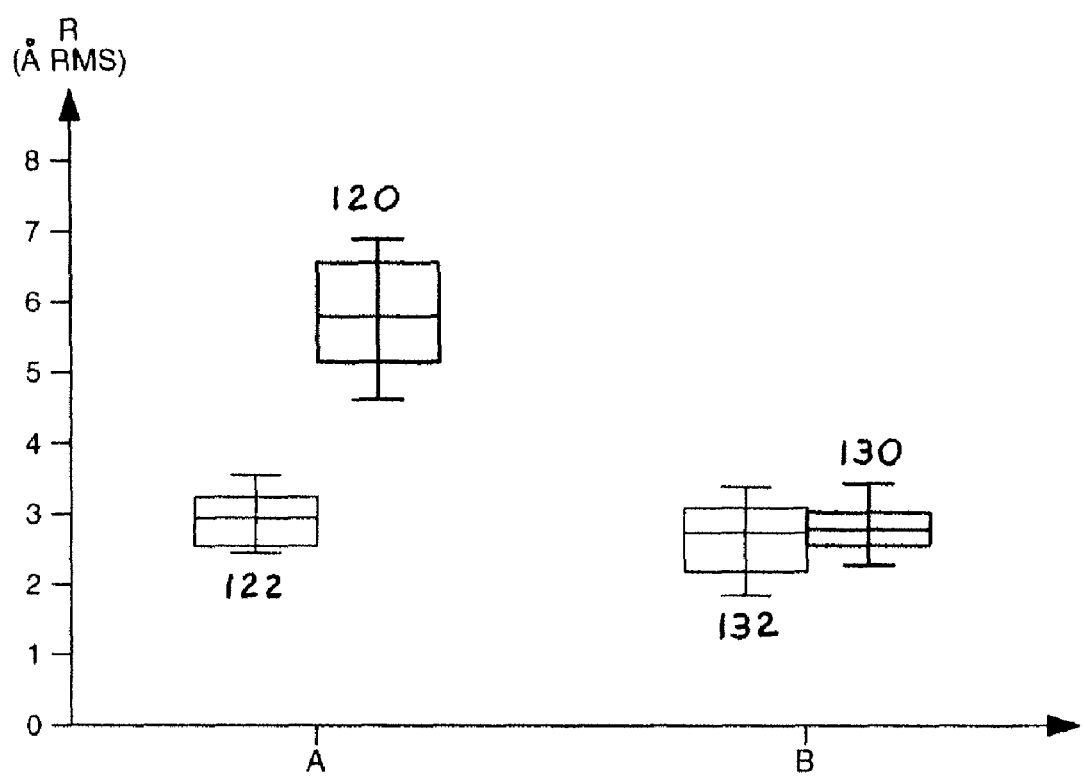
FIG. 4 is a comparison of the surface roughness of a prior art SOI substrate versus an SOI substrate prepared in accordance with one embodiment of the present invention.

FIG. 4 illustrates a comparison of the surface roughness of a thin silicon layer resulting from prior art process A, versus that of the present invention, B. The results are plotted in FIG. 4 on the y-axis, with the RMS roughness R of the thin silicon active layer of the SOI substrate expressed in angstroms for a scanning area of 30 μm×30 μm. Roughness R is expressed by an RMS (Root Mean Square) value. It is measured by AFM (Atomic Force Microscopy), the tip of which scans an area expressed in square microns. The thickness of the silicon layer on the surface of the donor substrate prior to the processes was 150 nm. The measurements were made each time in the center of the substrate (results shown by the fine lines) and on the edge (results shown by the bold lines).

Both processes include the steps of weakened zone formation, detachment, and finishing. In prior art process A, the weakened zone was formed by implantation of $H^+$ ions, followed by thermal detachment, and sacrificial oxidation and long annealing at a temperature not exceeding 1100° C. In case B, the weakened zone was formed by co-implanting helium and hydrogen, followed by thermal detachment and finishing by sacrificial oxidation and long annealing at a temperature not exceeding 1100° C.

The process of the present invention shows a markedly beneficial effect on the edge of the substrate by a noticeable reduction in roughness along the dense zone when compared to the method according to the prior art. The roughness of the edge of the substrate resulting from the prior art process is noted by reference number 120, and the roughness of the edge of the substrate resulting from the process of the present invention is notated with reference number 130. Similarly, the roughness of the center of substrate from the prior art process is noted by reference number 122, and the roughness in the center of the substrate from the process of present invention is noted by reference number 132. As shown in FIG. 4, the roughness of the edge 130 resulting from the process of the present invention is significantly less than the roughness of the edge 120 that results from the process of the prior art. In addition, the RMS roughness values for the present invention for both the edge 130 and the center of the substrate 132 are low, less than 3 ångströms for a scanning area of 30 μm×30 μm. Also, the values are homogeneous over the entire area of the substrate, and are reproducible.

Furthermore, at annealing temperatures not exceeding 1100° C., the diffusion of oxygen coming from the buried silicon oxide layer is greatly reduced, so that the thickness of the buried silicon oxide layer remains uniform. Finally, by annealing at a temperature not exceeding 1100° C. it is possible to control the risk of contamination by metals and the risk of defects created in the wafers, such as slip lines, caused by the thermal stresses. This makes annealing much easier to carry out on an industrial scale.

EXAMPLES

Illustrative examples of the invention will be given below.

Example 1

A silicon donor substrate, covered with a 150 nanometer silicon dioxide layer, underwent a successive co-implantation of hydrogen and then helium with the parameters mentioned below:

helium: dose=$1\times10^{16}He^+/cm^2$; energy=50 keV;
hydrogen: dose=$1\times10^{16}H^+/cm^2$ ; energy=30 keV.

After the donor substrate was bonded onto a silicon receiver substrate, the process of detaching and transferring a thin silicon layer with a thickness of about 250 nanometers, as well as subsequent detachment of the donor substrate along the weakened zone was accomplished by annealing at a temperature of about 500° C. The thin silicon layer then underwent a sacrificial oxidation step of oxidation followed by deoxidation to produce a thin silicon layer of about 190 nanometers on top of the buried silicon oxide layer. Finally, a thermal annealing operation was carried out for a time of 4 hours, at a temperature of 1100° C., in a gaseous atmosphere containing exclusively hydrogen and argon.

The RMS roughness of the surface of the thin silicon layer was homogeneous and from 2 to 3 ångströms for an AFM scanning area of 30 μm×30 μm. The thickness of the buried oxide (SiO$_2$) layer was not modified and remained practically homogeneous over the entire area. The measured uniformity was better than 1.8 nm, for an initial SiO$_2$ thickness of 145 nm.

Example 2

A silicon donor substrate, covered with a 150 nanometer silicon dioxide layer, underwent a successive co-implantation of hydrogen and helium with the parameters mentioned below:
 hydrogen: dose=2×10$^{16}$H$^+$/cm$^2$; energy=30 keV;
 helium: dose=2×10$^{16}$He$^+$/cm$^2$; energy=50 keV.

After the donor substrate was bonded onto a silicon receiver substrate, the process of detaching and transferring a thin silicon layer with a thickness of about 250 nanometers was carried out. This detachment step was carried out first by annealing at a temperature of about 350° C. for 2 to 3 hours, which did not result in detachment, followed by the application of an energy pulse, for example a shock, which mechanically triggered self-sustained detachment. Finally, a sacrificial oxidation was carried out, followed by thermal annealing under the same conditions as in the case of example 1. The same results as in example 1 were obtained.

The process according to the invention makes it possible to obtain an SOI substrate in which the thin silicon active layer has a uniform surface roughness, free of the dense zones present in processes of the prior art, while still having a buried oxide layer of uniform thickness. In addition, the various finishing treatments result in a thin silicon active layer having a low RMS roughness, i.e. around 2 to 3 ångströms (Å) for an AFM microscope scan of 30 μm×30 μm. Thus, SOI substrates of excellent quality are obtained that are particularly suitable for applications in the fabrication of electronic components for which they are intended.

The invention is also particularly advantageous in the case of SOI substrates having:
 a thin upper silicon layer with a thickness of 200 nanometers (nm) or less since, despite this small thickness, dissolution of the buried oxide layer does not take place; and/or
 a thin buried oxide (SiO$_2$) layer having a thickness of 50 nanometers (nm) or less, since, even in this case, the loss of thickness uniformity remains small.

The embodiments illustrated and discussed in this specification are intended only to teach those skilled in the art the best way known to the inventors to make and use the invention. Nothing in this specification should be considered as limiting the scope of the present invention.

All examples presented are representative and non-limiting. The above-described embodiments of the invention may be modified or varied, without departing from the invention, as appreciated by those skilled in the art in light of the above teachings. Accordingly, all expedient modifications readily attainable by one of ordinary skill in the art from the disclosure set forth herein, or by routine experimentation therefrom, are deemed to be within the spirit and scope of the invention as defined by the appended claims.

What is claimed is:

1. A process for maintaining uniform oxide layer thickness while minimizing surface roughness when fabricating a silicon on insulator (SOI) substrate, which comprises:
 implanting atomic or ionic species into a semiconductor donor substrate to form a weakened zone therein, with the weakened zone forming a boundary between a thin active layer and a remainder of the donor substrate;
 bonding the donor substrate to a semiconductor receiver substrate by molecular adhesion, with one of the substrates including a uniform oxide surface layer that is present between the donor substrate and the receiver substrate at a certain thickness as a buried oxide layer after bonding;
 detaching the remainder of the donor substrate along the weakened zone to obtain a SOI substrate comprising the receiver substrate, the oxide layer and the thin active layer, wherein the thin active layer has an exposed surface and a thickness of 150 nanometers or less;
 thermally annealing the thin active layer for at least 10 minutes in a gaseous atmosphere containing hydrogen, argon or both at a temperature of at least 950° C. but not exceeding 1100° C. to avoid a reduction in the uniform thickness of the oxide layer due to dissolution and to provide the buried oxide layer with a thickness of 50 nanometers or less and a thickness uniformity of 1.8 nm or better; and
 minimizing roughness of the exposed surface of the thin active layer by avoiding formation of dense zones adjacent the thin active layer in conjunction with the annealing,
 wherein the formation of the dense zones is avoided by conducting the implantation as a co-implantation of two different atomic species or by initiating the detaching by mechanical action along the weakened zone.

2. The process of claim 1, which further comprises forming the oxide layer either by thermal oxidation of the donor substrate, thermal oxidation of the receiver substrate, or both prior to bonding the donor and receiver substrates to each other so that the oxide layer lies at an interface between the substrates.

3. The process of claim 1, wherein the annealing is carried out for a maximum time of 15 hours.

4. The process of claim 1, wherein the thin active layer has, over its entire extent, an RMS surface roughness of less than 3 ångströms over a scanning area of 30 μm×30 μm.

5. The process of claim 1, wherein the thin active layer has a thickness of 100 nanometers or less.

6. The process of claim 1, wherein the buried oxide layer has a thickness uniformity of 1 to 1.5 nm or better after thermal annealing.

7. The method of claim 1 wherein at least two different atomic or ionic species are co-implanted into the donor substrate to form a weakened zone therein.

8. The method of claim 7 wherein the co-implantation is conducted with helium and hydrogen species.

9. The method of claim 1, wherein the weakened zone is formed by implantation of one or more species and the detaching is initiated by a mechanical action along the weakened zone.

10. The process as of claim 9, wherein the detaching comprises:
 applying a heat treatment for further weakening of the weakened zone, without initiating thermal detachment of the active thin layer from the remainder of the donor substrate, and
 applying a pulse that induces self-sustained detachment of the active thin layer from the remainder of the donor substrate.

11. The process of claim 1, which further comprises conducting at least one sacrificial oxidation of a free surface of the active thin layer, followed by a deoxidation to remove the material damaged by the detaching.

12. The process of claim 11, wherein the sacrificial oxidation is carried out under dry or wet conditions, at a temperature between 700° C. and 1100° C.

13. The process of claim 1, wherein the semiconductor receiver substrate comprises silicon.

14. The process of claim 13, wherein the semiconductor donor substrate comprises silicon so that the thin active layer also comprises silicon.

15. The process of claim 14, which further comprises forming the oxide layer as silicon dioxide either by thermal oxidation of the donor substrate, thermal oxidation of the receiver substrate, or both prior to bonding the donor and receiver substrates to each other so that the silicon oxide layer lies at an interface between the substrates.

* * * * *